(12) United States Patent
Bruley et al.

(10) Patent No.: US 7,247,946 B2
(45) Date of Patent: Jul. 24, 2007

(54) ON-CHIP CU INTERCONNECTION USING 1 TO 5 NM THICK METAL CAP

(75) Inventors: John Bruley, Poughkeepsie, NY (US); Roy A. Carruthers, Stormville, NY (US); Lynne Marie Gignac, Beacon, NY (US); Chao-Kun Hu, Somers, NY (US); Eric Gerhard Liniger, Sandy Hook, CT (US); Sandra Guy Malhotra, Beacon, NY (US); Stephen M. Rossnagel, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 124 days.

(21) Appl. No.: 11/037,970

(22) Filed: Jan. 18, 2005

(65) Prior Publication Data

US 2006/0160350 A1    Jul. 20, 2006

(51) Int. Cl.
  *H01L 23/48* (2006.01)
  *H01L 23/52* (2006.01)
  *H01L 29/40* (2006.01)

(52) U.S. Cl. ..................... 257/751; 438/622

(58) Field of Classification Search ............... 438/622, 438/633, 643, 644, 687, 692; 257/751, 758, 257/762
See application file for complete search history.

(56) References Cited

U.S. PATENT DOCUMENTS 6,399,496 B1 * 6/2002 Edelstein et al. ........... 438/687
6,479,389 B1 * 11/2002 Tsai et al. ................... 438/697
* cited by examiner

*Primary Examiner*—Phuc T. Dang
(74) *Attorney, Agent, or Firm*—Scully, Scott, Murphy & Presser, P.C.; Robert M. Trepp, Esq.

(57) ABSTRACT

Disclosed is a procedure to coat the free surface of Cu damascene lines by a 1-5 nm thick element prior to deposition of the inter-level dielectric or dielectric diffusion barrier layer. The coating provides protection against oxidation, increases the adhesion strength between the Cu and dielectric, and reduces interface diffusion of Cu. In addition, the thin cap layer further increases electromigration Cu lifetime and reduces the stress induced voiding. The selective elements can be directly deposited onto the Cu embedded within the under layer dielectric without causing an electric short circuit between the Cu lines. These chosen elements are based on their high negative reduction potentials with oxygen and water, and a low solubility in and formation of compounds with Cu.

14 Claims, 5 Drawing Sheets

ON-CHIP CU INTERCONNECTION USING 1 TO 5 NM THICK METAL CAP

BACKGROUND OF THE INVENTION

1. Field of the Invention

This invention relates to the general field of copper-based interconnections for integrated circuits.

2. Description of the Prior Art

The industry need for increased integrated circuit (IC) chip performance beyond 0.25 μm technology in conjunction with decreasing feature size is causing migration of interconnect systems to lower resistivity Cu based-conductors. Modem commercial Cu IC chips, which usually contain 4 to 8 levels of Cu interconnections, are generally fabricated by a single and/or dual damascene process. The two most important on-chip interconnection reliability issues are electromigration and stress induced voiding in the Cu interconnect circuit elements. Electromigration in copper metallization for IC chips has been extensively studied. Electromigration and stress induced voiding are the motion of atoms by diffusion in an electrical field and stress gradient, respectively. When an interconnect is electrically stressed in a dc current, the drifting of Cu atoms can cause mass depletion (resulting in a void or an open circuit) or accumulation (resulting in an extrusion or a short-circuit) at the locations where the microstructure and/or materials are varied such that an imbalance of atom flux exists. Hu et al. (Proceedings of 1999 International Interconnect Technology, p. 197) reported that Cu mass transport in Cu interconnects occurs primarily at the surface interface, not at grain boundaries. In Cu interconnection structures the top surface of a line is generally covered by an insulator, e.g., silicon nitride, and the bottom and sides of the line are covered with a liner, e.g. TaN/Ta. The Cu lines are connected to other lines through inter-level vias. Since diffusion at the top Cu/silicon nitride interface is dominant in Cu, then the electromigration flux is constrained to the top interface within an area of $\delta_s w$, where $\delta_s$ is the effective thickness of the interface region and w is the line width. The relative amount of flux, at constant line current density, j, flowing through the interface region is proportional to the interface area divided by line area ratio, $\delta_s w/(wh)$, or $\delta_s/h$, where h is the line thickness. The Cu electromigration lifetime τ, is $\Delta L/V_d = \Delta L\ h\ kT/(\delta_s D_s F_e)$, where $\Delta L$ is the critical void length that causes failure, $V_d$ is the void growth rate, $D_s$ is the interface diffusivity, k is the Boltzmann constant, T is the absolute temperature and $F_e$ is the electromigration driving force at the interface. $\Delta L$ is generally equal to the inter-level via size. The above equation shows that the lifetime is controlled by the interface diffusivity, $D_s$. To fully utilize Cu chips as the feature size is scaled to smaller dimensions (which causes higher current densities and even more electromigration), the fast diffusion pathway along interfaces, $D_s$, must be altered. The intents and purposes of this invention are to modify the property of the top surface of Cu lines in a damascene structure such that fast diffusion can be reduced. This will result in increased circuit lifetime (reliability) due to reduced electromigration or stress-induced failures.

In Cu damascene processing, U.S. Pat. Nos. 4,954,142, 4789,648, and 4,702,792, vias and trenches are etched in an insulator material, metal is deposited to fill these cavities, and chemical mechanical polishing (CMP) is used to remove the excess metal and form metal vias and lines. The metal fill: metal liner, Cu seed layer and Cu main conductor, are produced by a combination of physical vapor deposition and electroplating deposition techniques. The Cu interconnects (lines and vias) are embedded in a dielectric. Hu et al. (Thin Solid Films, 262, p. 84-92, 1995) reported that the Cu interconnections require metal and insulator adhesion/diffusion barrier layers in addition to main Cu conductors. U.S. Pat. No. 6,342,733 discloses the use of an electroless selective deposition film on the top of the Cu surface from a selective group of CoWP, CoSnP, CoP, Pd, CoB, CoSnB, In, NiB and W for reduced electromigration and stress induced migration of Cu wires. E. G. Colgan reported a selective CVD-W film for capping Cu damascene lines (Thin Solid Films, 262, p. 120-123 (1995)) for suppressed Cu hillock formation and oxidation protection. U.S. Pat. No. 5,447,599 teaches the use of Ti/Cu and Cu(Ti) alloy to form TiN(O) by thermally annealing and selective wet etching. U.S. Pat. No. 5,447,887 teaches the use of Cu silicide for improved adhesion between Cu and silicon nitride. U.S. Pat. No. 5,693,563 teaches an etch stop method for a Cu damascene process using a blanket film TiN 50 to 200 nm thick, on the top of a Cu damascene line, followed by patterning TiN using photo-resist and then etching. U.S. Pat. No. 5,968,333 extends the common electroplating method of using pure Cu to fill the trenches/holes to the use of a Cu(Al) alloy. U.S. Pat. No. 6,136,707 discloses the use of multiple Cu seed layers with various deposition techniques for improving main conductor electroplating in Cu or Ag processes. U.S. Pat. No. 6,181,012 teaches the use of Cu alloy seed layer for improving electromigration resistance, and the adhesion/surface properties of Cu interconnections. U.S. Pat. No. 5,023,698 discloses the use of copper alloys containing at least one alloying element selected from group of Al, Be, Cr, Mg, Ni Si, Sn and Zn. U.S. Pat. No. 5,077,005 discloses the use of copper alloys containing at least one alloying element selected from group of In, Cd, Sb, Bi, Ti, Ag, Sn, Pb, Zr and Hf where the weight percent of the alloying element used is between 0.0003 to 0.01. U.S. Pat. No. 5,004,520 discloses the use of a copper foil for film carrier applications containing at least one alloying element selected from group of P, Al, Cd, Fe, Mg, Ni, Sn, Ag, Hf, Zn, B, As, Co, In, Mn, Si, Te, Cr and Zn with impurity concentration from 0.03 to 0.5 weight percent. U.S. Pat. No. 4,749,548 discloses the use of copper alloys containing at least one alloying element selected from group of Cr, Zr, Li, P, Mg, Si, Al, Zn, Mn, Ni, Sn, Be, Fe, Co, Y, Ce, La, Nb, W, V, Ta, B, Hf, Mo and C to increase the strength of the copper alloys. However, none of this prior art discloses the use of Cu interconnections constructed by directly depositing very thin layers of 0.5 to 5 nanometers on the top Cu surface from a selected group of metal elements having both a high negative reduction potential with oxygen and the ability to form compounds with copper. The use of this new innovation will sufficiently improve the Cu interconnects so that Cu ULSI on-chip wiring can be extended to future generations.

SUMMARY OF THE INVENTION

An object of the invention is to improve the Cu interconnects of an integrated circuit, so that Cu ULSI on-chip wiring can be extended to future generations.

Another object of this invention is to provide Cu damascene interconnect features with the top surface of the lines directly coated with a 0.5 to 5 nm thick metal layer to improve electromigration and corrosion resistance, enhance adhesion, and reduce stress induced voiding.

A further object of the invention is to modify the property of the top surface of Cu lines in a damascene structure in an integrated circuit such that fast diffusion can be reduced, resulting in increased circuit lifetime (reliability) due to reduced electromigration or stress-induced failure.

In accordance with this present invention, there is provided Cu damascene interconnect features with the top surface of the lines directly coated with a 0.5 to 5 nm thick metal layer which improves electromigration and corrosion resistance, enhances adhesion, and reduces stress induced voiding.

In a preferred embodiment, Cu interconnections which are used to provide electrical communications to an electronic device is provided which includes a body that is formed substantially of a copper or copper alloy conductor and a film containing 0.5 to 5 nm, which is equivalent to 2 to 25 atomic layers of a metal deposited on both the top surface of a Cu line and dielectric material. The selected metal deposited on dielectric material will convert to a metal oxide. The thin layer is formed by at least one element from a selected group of Al, Ca, Hf, Mg, In, P, Pr, Sb, Se, Sn, Ti, V, and Zr.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
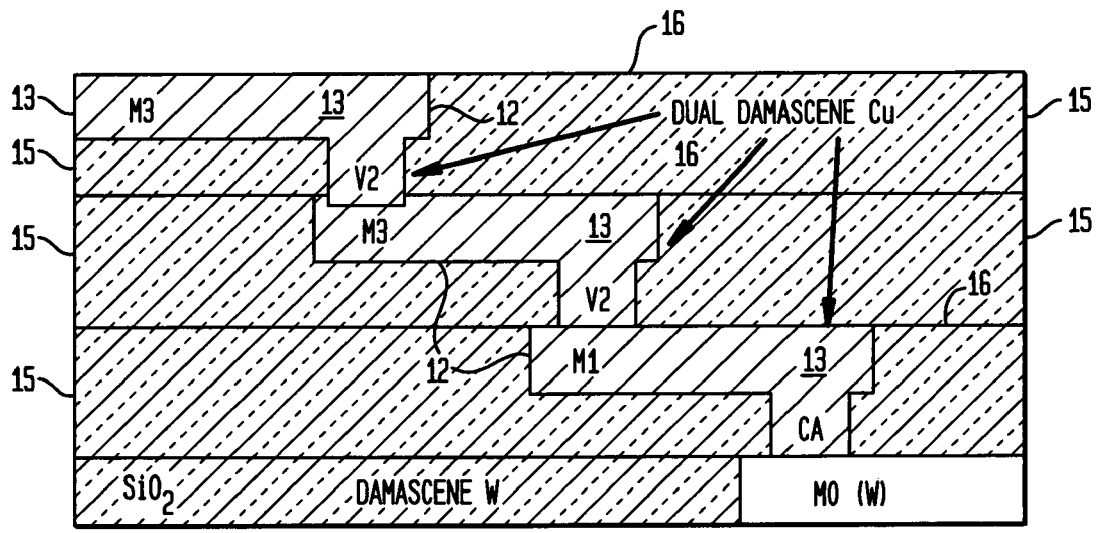
FIG. 1 is a schematic representation of a cross-sectional view of Cu damascene interconnections.

A schematic of a cross-sectional view of conventional Cu interconnections is shown in FIG. 1. The electronic structure 1 contains a typical three-level Cu dual-damascene interconnection. The adhesion/diffusion metal liner (e.g. TaN/Ta, TaTi) 12 and a body of Cu conductor 13, insulator ($SiO_2$, low dielectric constant materials) 15 and adhesion/diffusion insulator layer (e.g. $SiN_x$) 16 which are the fundamental layers for the damascene structure are shown. The local interconnection W M0 is connected to the first level Cu lines M1 by the inter-level vias CA. The second level Cu M2 line are connected to M1 and the third level Cu line M3 by V1 and V2 vias, respectively, embedded within the under layer dielectric without causing an electric short circuit between the Cu lines.

Figure 2:
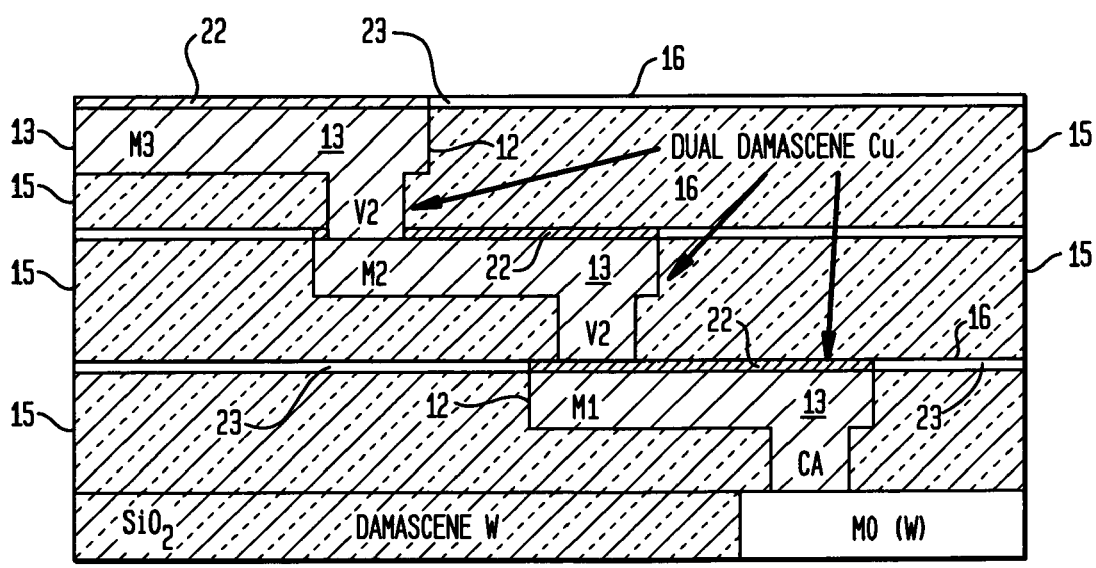
FIG. 2 is a schematic representation of a cross-sectional view of Cu damascene interconnections in accordance with embodiment of this invention.
Figure 3:
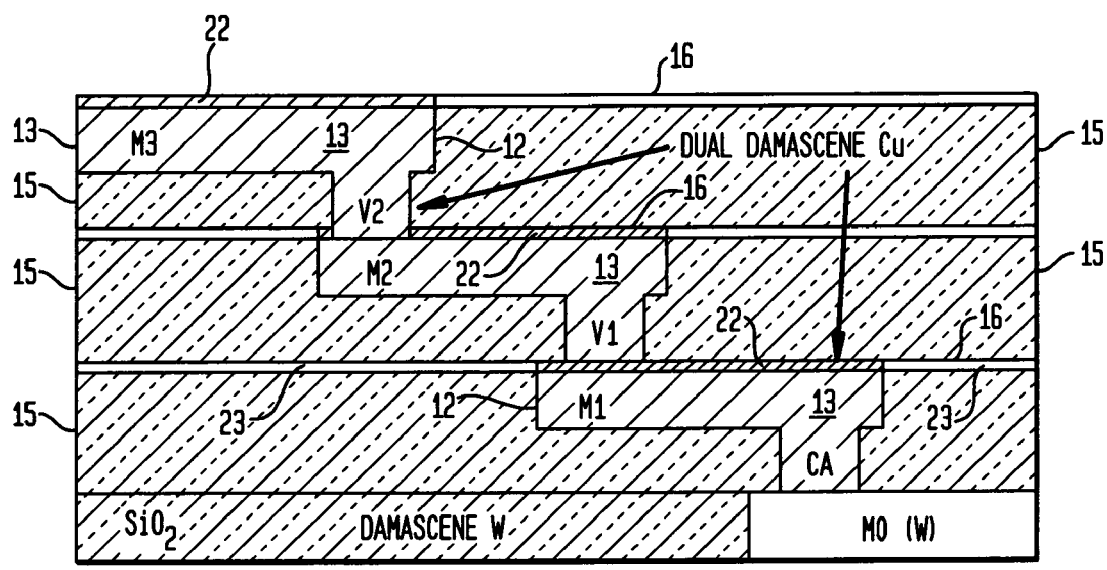
FIG. 3 is a schematic representation of a cross-sectional view of Cu damascene interconnections in accordance with embodiment of this invention. The metal oxide layer in FIG. 2 was selectively removed.

The subjects of electromigration, stress-induced migration, corrosion and adhesion in on-chip Cu interconnections are all related to the properties of the top surface of the Cu damascene lines. The fast Cu surface diffusion, lack of protective native Cu oxide, and poor bonding energy between Cu and dielectric materials results in reliability problems in the Cu on-chip interconnections. FIGS. 2 and 3 are schematic diagrams of two embodiments of Cu interconnections formed by a dual damascene process and capped Cu lines with a thin layer 0.5 to 5 nm from a selected group of elements: Al, Ca, Hf, Mg, In, P, Pr, Sb, Se, Sn, Ti, V, Zr. The chosen elements are based on their high negative reduction potentials with oxygen and water, and a low solubility in and formation of compounds with Cu. These elements can be directly deposited on the top of Cu lines embedded within the under layer dielectric without causing an electric short circuit between the Cu lines. When these materials are deposited on top of the dielectric surfaces located adjacent to the Cu lines, they either oxidize immediately or can be oxidized in a subsequent step. Once they are oxidized, they are no longer conductive and cannot make electrical connection or a short circuit between nearby Cu lines and features. Furthermore, a serial experiment was also carried out to find out which elements in the above selected group could prolong the Cu electromigration lifetime, reduce the stress-induced voiding and corrosion, and increase the adhesion strength. The Cu damascene lines with a metal capping layer, especially with Sb, can achieve electromigration reliability (i.e, resistance to electromigration effects) that is far better than any cases reported for the Cu lines without the capping layer.

In FIGS. 2 and 3, three-level interconnects 20 and 30, respectively are shown as being formed of Cu dual-damascene lines 13, in accordance with this invention. Cu lines capped with a 0.5 to 5 nm thick layer 22 and its oxide 23 between the line 13 in FIG. 2. The oxide 23 can be used or removed in this invented structure. The dielectric materials 15 are $SiO_2$ and/or other low dielectric constant (k) materials and the dielectric diffusion-adhesion barrier layer 16 is $SiN_x$ or other low k materials. FIG. 3 shows that interconnects with capped Cu 22 only, with no oxide 23 between the lines. The metal liners, typical TaN/Ta, refractory elements and/or their nitride 12 are also shown in FIGS. 2 and 3. The layers 22 and 23 are obtained by directly depositing the chosen elements on top of Cu damascene lines 13 before the deposition processes of layer 16 or 15.

In the course of this invention, the wafer temperature (T) for the deposition of the chosen element on the top of the Cu lines was found to be critical. This is due to the presence of a thin polymeric layer of a material known as BTA, which is applied to the Cu surface at the termination of Chemical Mechanical Polishing (CMP) to protect the fresh, polished Cu surface from corrosion or wet etching. After the Cu damascene lines 12 were formed by CMP, the wafer was heated in vacuum to 200° C. for In, Sn, and Al, and 300° C. or higher for Sb, Ti, Zr, Hf, V. At these temperatures, the BTA is partly driven from the surface thermally, and the deposition of the thin metal films (of In, Sn, Al, Sb, Ti, Zr, Hf and V) will break down the residual BTA protective layer on the Cu surface. Once the inhibitor is removed, the chosen elements will react with the surface of the Cu line to form intermetallic compounds during the deposition. The elements can be deposited in vacuum by either physical vapor deposition (PVD) (sputtering), chemical vapor deposition (CVD), or atomic layer deposition (ALD), or else outside of the vacuum chamber in an electroplating cell. These Cu-rich surface compounds can provide a protection layer to limit corrosion of the Cu line. More importantly, they improve the bonding between the Cu line feature and the subsequently-deposited dielectric material of the overlayer. This greatly reduces the diffusion of Cu along the Cu-dielectric interface. The elements can also diffuse into the Cu line to strengthen the Cu grain boundaries. The very thin nature of the deposited metal films (0.5-5 nm) will mean that the net bulk composition of the added metal species in the bulk Cu will remain low, which will make any increase in the electrical resistivity minimal.

The thin metal layer deposited on the top of the dielectric material will completely convert to oxide, either spontaneously upon deposition or once it is exposed to air and moisture following the deposition because the film is extremely thin, only 0.5 to 5 nm thick, and it has a high negative reduction potential with oxygen. Once converted to an oxide, the capping film will not cause an electrical short-circuit between lines. The reacted, dielectric capping film on the bulk dielectric regions can be left on as an etch stop for a later inter-level via process or removed by selective wet and/or dry etching processes. If the Cu-compound layer at the surface of the Cu line is oxidized during the oxygen or water exposure step, the native oxide can be removed by either sputter etching, a wet chemical clean or a subsequent deposition of a reactive metallic film or liner.

Experiments were carried out to measure the Cu line resistance with 0.28 um and 0.51 um wide lines as a function of many of the coating elements listed, wafer deposition temperatures and sample annealing temperatures. For example, the elements Al and Ti were deposited, 4 nm thick, onto an embedded Cu line in a silicon dioxide dielectric using e-gun evaporation at $10^{-7}$ Torr at wafer temperature of 25° C. Following deposition, there was no measurable change in the Cu line resistance; nor was any change observed on these Cu lines after the samples were annealed at 400° C. for 1 hour in helium. Since Ti and Al did not react with Cu during the room temperature deposition, all the Al and Ti reacted with air/water and formed metallic surface oxide after breaking vacuum. Once an oxide is formed, Ti and Al oxides cannot react with or diffuse into Cu, thus there was no measurable line resistance increase. An Al and/or Ti oxide film on the Cu surface cannot improve the reliability of Cu interconnects, however. Next, when Al is deposited at 200° C., the reaction and interdiffusion between Al and Cu take place and result in an increase of the Cu line resistance. A 4 nm thick Al or In film can increase Cu line resistance by as much as 18%. This suggests that a reaction and interdiffusion between Ti or Al and Cu has occurred during the deposition process step.

Figure 4:
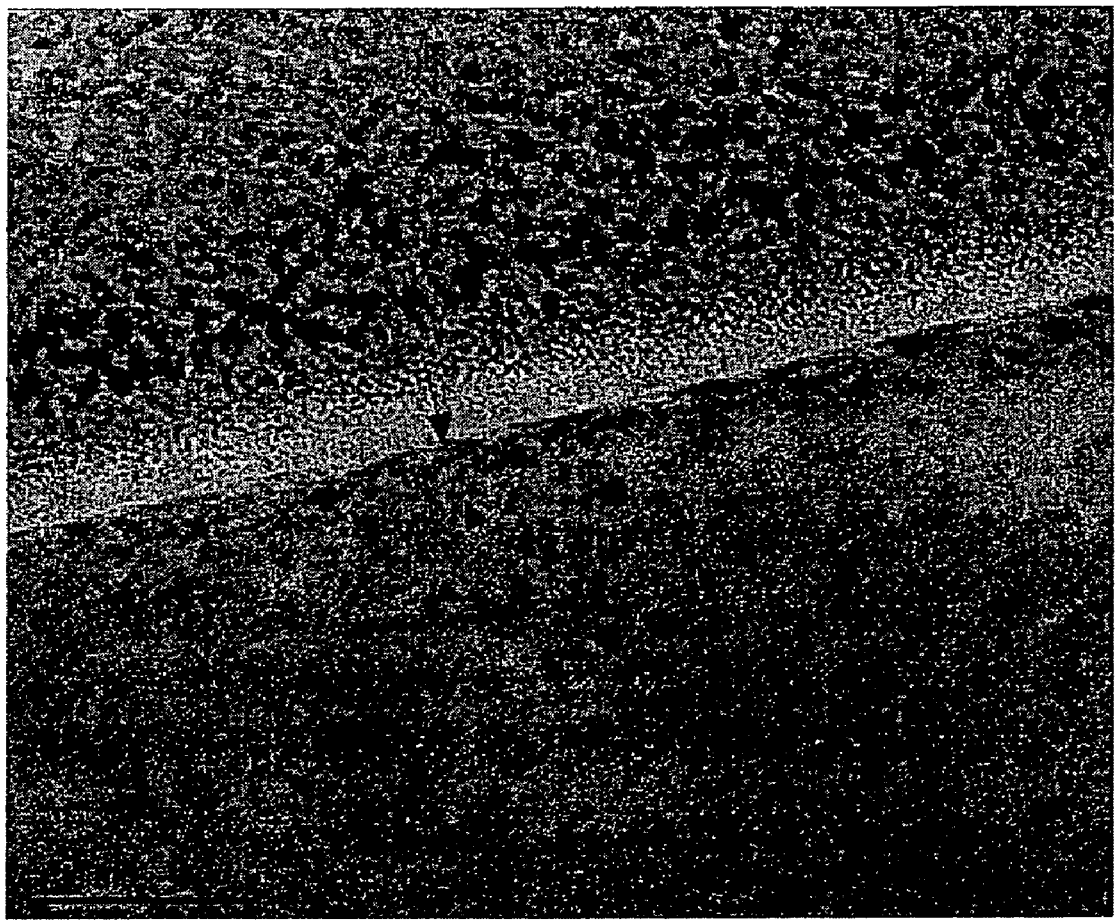
FIG. 4 is a TEM image of a cross sectional view of a 1 nm Sb capped Cu line deposited at 300° C. The 26 nm thick Sb rich layer containing dislocation loops is shown.
Figure 5:
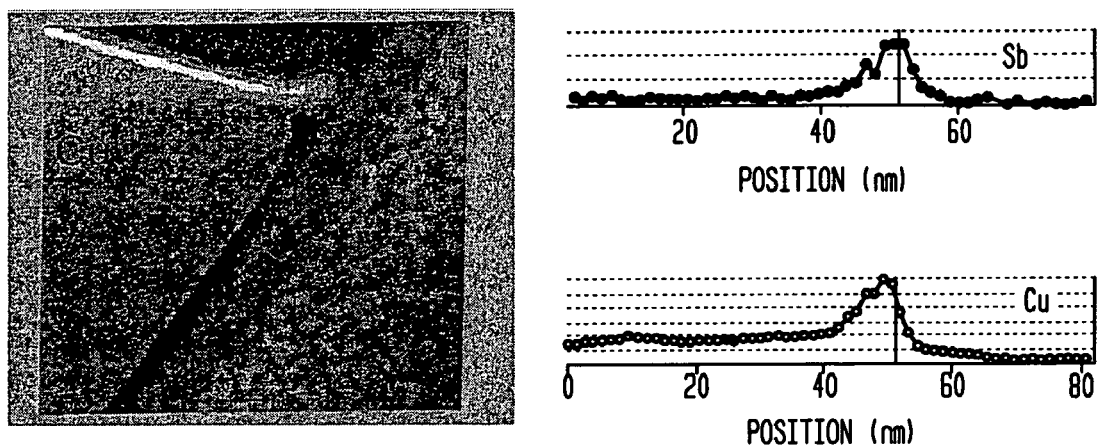
FIG. 5 is a TEM image of a cross sectional view of Cu line capped with 1 nm Sb (right) and intensity counts of Sb and Cu from x-ray line scan taken across the top of Cu surface (left).

Transmission electron microscope (TEM) and energy dispersive x-ray spectroscopy (EDS) were used to examine Cu lines which were capped with Sb and In. Inspection of a Sb 1 nm thick capped sample shows an approximately 26 nm thick layer at the top surface of the Cu line which is composed of Cu doped with Sb (see FIGS. 4 and 5). This layer appears to be densely packed with small dislocation loops. The bulk Cu in the line below the 26 nm thick altered layer also contains small and extended dislocations along with common twinning defects. Chemical analysis of this layer indicates that Sb is distributed within the defective region at a very low concentration. Whether the Sb is segregated to the dislocation loops or is uniformly distributed in the Cu in this region cannot be discerned from this data set.

Figure 6:
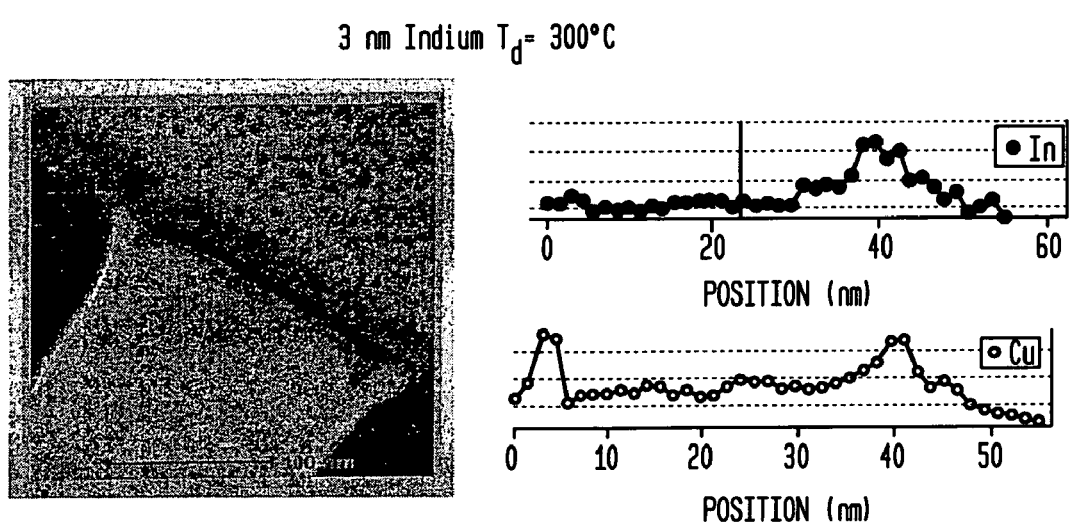
FIG. 6 is a TEM image of a cross sectional view of Cu line capped with 3 nm In (right) and intensity counts of In and Cu across the top of Cu surface (left).

TEM inspection of the thin In capped Cu lines in FIG. 6 shows the distribution of In to be highly variable from line to line in nested regions or areas of closely-packed lines. The dielectric surfaces adjacent to the Cu lines are found to be indium oxide. The surface layer of In-doped Cu is strained though not as highly as the Sb capped sample.

Figure 7:
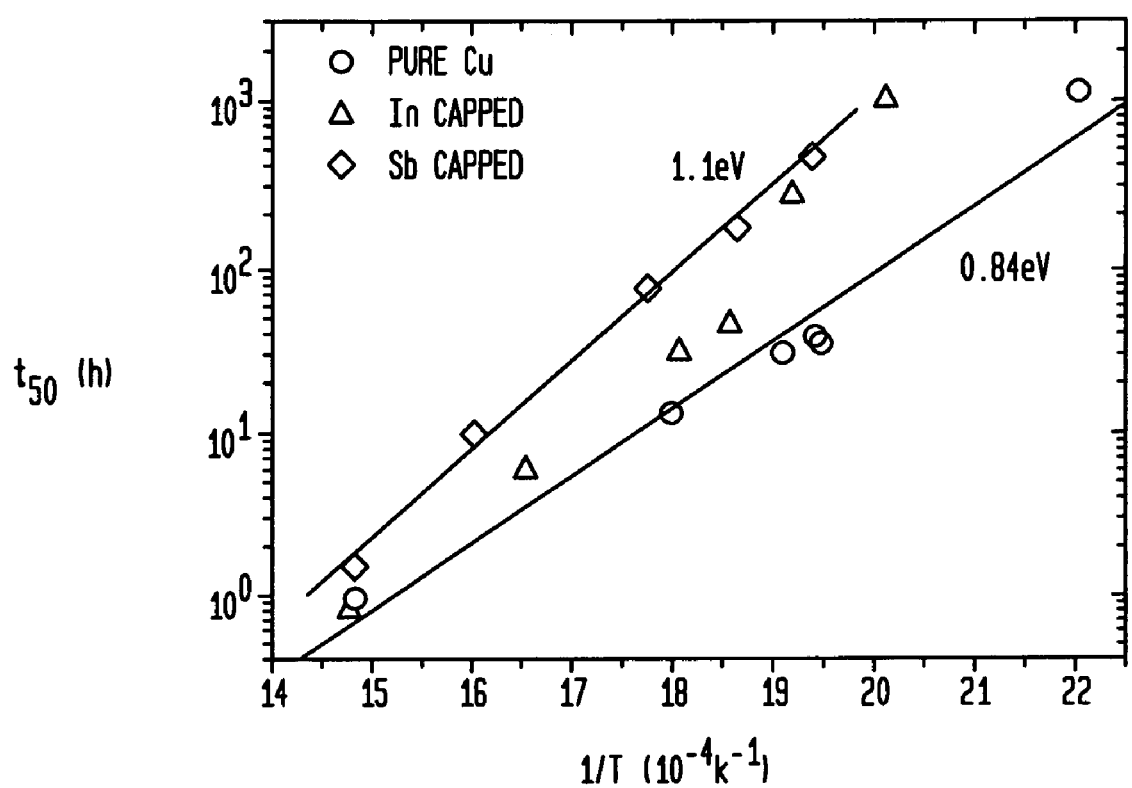
FIG. 7 is a Plot of the electromigration median lifetimes of 0.18 μm wide Cu damascene line vs. 1/T.

The effect of impurities, such as carbon, oxygen, nitrogen, and $H_2S$, on Cu surface diffusion has been reported. The measured surface diffusion values depend strongly on the atmosphere in which diffusion takes place. The Cu surface diffusivity is generally higher in an oxygen or vacuum environment than in a hydrogen atmosphere. This suggests that oxygen may remove the inhibiting effect of surface impurities. However, metallic impurities on Cu surfaces are seldom reported. U.S. Pat. No. 6,342,733 reports that an electroless selective deposition film of CoWP, CoSnP, or Pd on the top of the Cu surface substantially increases the electromigration resistance. To understand the effect impurities have on electromigration in Cu, 1-3 nm thick films of Al, Hf, Mg, In, Sb, Re, Co, W, Ti, V, Ta, Nb, Si, or Zr were directly deposited on the surface of individual Cu lines embedded in silicon dioxide. The electromigration lifetime of a two-level structure consisting of 0.18 □m wide bamboo-like Cu dual damascene lines on W underlying lines was measured. The samples were tested in a vacuum furnace with a chamber pressure of 10-30 Torr of forming gas ($N_2$+5% $H_2$). The results showed that Al, Ta, Nb, Re, Co, W, V, and Zr cap layers on Cu have little effect on the Cu migration rate. On the other hand, Mg and Si have a deleterious effect that results in decreasing the Cu electromigration lifetime. However, Ti, Hf, In and Sb increase the Cu lifetime and Sb is found to work the best against electromigration damage. According to the theoretical prediction, the Cu void growth rate at the cathode end of the line is the same as the Cu drift velocity because the end of the M1 line is connected to a completely blocking boundary W line. Thus the extracted activation energy from these samples is the same as the activation energy of Cu electromigration surface diffusion. The median lifetime as a function of 1/T is plotted in FIG. 7. The electromigration activation energies of Cu surface diffusion with and without Sb capping layers are found to be 1.1 eV and 0.84 eV, respectively. The effect on electromigration in Cu with Sb and In caps is correlated to the existence of a Sb or In rich region on the top of Cu surface (shown in FIGS. 5 and 6). The usual fast diffusion path along the top of the Cu surface is slowed down by the impurities of Sb or In. Since the Cu mobility is reduced, mass flow from the stress-induced force should be reduced. Thus stress-induced voiding in Cu lines should be drastically reduced for Cu lines with In or Sb caps.

While it is apparent that the invention herein disclosed is well calculated to fulfill the objects stated above, it will be appreciated that numerous modifications and embodiments may be devised by those skilled in the art and it is intended that the appended claims cover all such modifications and embodiments as fall within the true spirit and scope of the present invention.

What is claimed is:

1. A multi-level interconnection structure comprising dual or single damascene Cu interconnects capped with 0.5-5 nm thick films of selected elements, said elements having a standard reduction of potential for electrochemical series from −0.01V to −4V, and a low solubility, less than 3 atomic percent at 300° C., and form compounds with Cu.

2. An interconnection structure according to claim 1, wherein said Cu interconnection comprises Cu capped with at least one element selected from the group consisting of Sb, In, Sn, Hf, Ti and P for improved electromigration resistance, and reduced stress induced voiding and corrosion resistance of said interconnection structure.

3. An interconnection structure according to claim 1, wherein said Cu interconnection comprises a metal capping layer, which has the thickness between 0.5 to 5 nm.

4. An interconnection structure according to claim 1, wherein said Cu interconnection comprises a body of Cu capped with between two to twenty five atomic layers of Sb, In, Sn, Hf, P, and Ti.

5. An interconnection structure according to claim 4, wherein said Cu interconnection comprises a body of Cu capped with between two and twenty five atomic layers of Sb, In, Sn, Hf, P, and Ti, which can be deposited by physical vapor deposition, chemical vapor deposition, electroplating, and/or atomic layer deposition techniques.

6. An interconnection structure according to claim 1, wherein said Cu interconnection comprises a Cu body capped with a thin metal layer of In and Sn deposited at a temperature above 200° C.

7. An interconnection structure according to claim 1, wherein said Cu interconnection comprises a Cu body capped with a thin metal layer of Sb, Hf, or Ti deposited at a temperature above 300° C.

8. A multi-level interconnection structure comprising dual or single damascene Cu interconnects capped with 0.5-5 nm thick films of selected elements, said elements having a standard reduction of potential for electrochemical series from −0.01V to 4V, and a low solubility, less than 3 atomic percent of 300° C., and form compounds with Cu;
wherein said Cu interconnection is comprised of a Cu body capped with a thin metal 0.5-5 nm thick layer which forms an intermetallic Cu compound and/or impurity rich region of 1 to 26 nm on the top surface of a Cu interconnect after Cu-impurity mixing at a sample temperature above 300° C.

9. A multi-level interconnection structure comprising dual or single damascene Cu interconnects capped with 0.5-5 nm thick films of selected elements, said elements having a standard reduction of potential for electrochemical series from −0.01V to 4V, and a low solubility, less than 3 atomic percent of 300° C., and form compounds with Cu;
wherein said Cu interconnection is comprised of a Cu line or feature which is capped with a thin metal layer and this same metal layer forms a metal oxide layer on the adjacent insulator surface.

10. An interconnection structure according to claim 1, wherein said Cu interconnection is comprised of a Cu line or feature which is capped with a thin layer having the property of high negative reduction potentials with oxygen and water, the capping layer will be exposed to the air.

11. An interconnection structure according to claim 2, wherein said Cu interconnection is comprised of a Cu line or feature, this capping layer comprises a Cu body capped with at least one element selected from the group consisting of Sb, In, Sn, Hf, Ti, P, C, N and O.

12. An interconnection structure according to claim 1, wherein said Cu interconnection is comprised of a Cu body capped with a thin metal layer, and the metal oxide which is formed on the insulator can be removed by a selective chemical etching process.

13. An interconnection structure according to claim 1, wherein said Cu interconnection is comprised of a Cu body capped with a thin metal layer and a metal oxide is formed on the insulator, this metal oxide can be used to serve as an etch stop for etching of subsequent layers which may be deposited over this structure.

14. An interconnection structure according to claim 1, wherein said Cu interconnection is comprised of a Cu body, line or feature capped with a thin metal layer embedded in the dielectric layers.

* * * * *